(12) United States Patent
Landsgestell et al.

(10) Patent No.: US 6,501,653 B1
(45) Date of Patent: Dec. 31, 2002

(54) ARRANGEMENT OF A MULTIPHASE CONVERTER

(75) Inventors: Juergen Landsgestell, Heilbronn (DE); Martin Eisenhardt, Renningen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/807,157

(22) PCT Filed: Oct. 2, 1999

(86) PCT No.: PCT/DE99/03185
§ 371 (c)(1),
(2), (4) Date: Jul. 3, 2001

(87) PCT Pub. No.: WO00/21187
PCT Pub. Date: Apr. 13, 2000

(30) Foreign Application Priority Data

Oct. 7, 1998 (DE) .......................................... 198 46 156

(51) Int. Cl.$^7$ ................................................ H05K 7/20
(52) U.S. Cl. ...................... 361/699; 361/702; 361/703; 361/704; 361/707; 174/15.1; 174/16.3; 165/80.3; 165/80.4; 165/185
(58) Field of Search ............................... 361/688–690, 361/698, 699, 702–704, 707, 719, 720; 174/15.1, 16.1, 16.3; 165/80.2, 80.3, 80.4, 80.5, 104.33, 185

(56) References Cited

U.S. PATENT DOCUMENTS 4,538,025 A * 8/1985 Coe et al. ................... 174/52.3
5,373,418 A * 12/1994 Hayasi ......................... 361/707
5,814,909 A * 9/1998 Yamada et al. ................ 310/64
5,914,860 A 6/1999 Janko
5,940,272 A * 8/1999 Emori et al. .................. 361/704
5,966,291 A * 10/1999 Baumel et al. ............... 361/707

FOREIGN PATENT DOCUMENTS

| EP | 0 677 916 | 10/1995 |
| EP | 0 766 504 | 4/1997 |
| WO | WO 92 19013 | 10/1992 |
| WO | WO 92/19013 | * 10/1992 |

* cited by examiner

Primary Examiner—Boris Chervinsky
(74) Attorney, Agent, or Firm—Kenyon & Kenyon

(57) ABSTRACT

The components of a multiphase converter, which contains semiconductor power components and a capacitor on a support containing cooling devices, are arranged in an optimally compact configuration, in which the support containing the cooling device is configured as a hollow body, the capacitor is or the capacitors are insertable in its interior in as tightly and precisely fitted fashion as possible, and the semiconductor power components are arranged on its outer side, where the height of the hollow body corresponds substantially to the height of the necessary capacitor. For a three-phase converter, the hollow body may be in the shape of a hexagon on the outer side, so that an overall shape approximating a cylinder is created, and a cylindrical cover protects everything and makes a compact component available, and for a two-phase converter, a parallelepipedal volume is optimally utilized.

13 Claims, 3 Drawing Sheets

ARRANGEMENT OF A MULTIPHASE CONVERTER

FIELD OF THE INVENTION

The present invention is based on a multiphase converter having semiconductor power components and a capacitor.

BACKGROUND INFORMATION

In multiphase converters that are equipped with semiconductor power components and a capacitor, a so-called buffer capacitor, in particular a high-power electrolytic capacitor, at least those components may be mounted on a support containing cooling devices. Supports that may be used may on the one hand be flat, rectangular cooling boards which contain cooling ducts through which a liquid coolant flows. Flat, rectangularly shaped supports on one of whose sides the components are attached, and on the other of whose sides cooling fins or cooling ribs are provided for air cooling, may also be used. Since, in higher-power converters, a very large capacitor may need to be provided as a so-called buffer capacitor, for which an electrolytic capacitor may be used, the overall height perpendicular to the support is determined by its relatively large height, and the extension in area of the support is determined both by the base outline of the capacitor and also, additively, by the relatively large power semiconductor attachment surfaces that need to be cooled. As a result, it is believed that a converter of this kind may require considerable space both in area and in terms of height. This space requirement may not be available in every application.

SUMMARY OF THE INVENTION

An object of an exemplary embodiment of the present invention is to arrange the components in such a way that considerably less space should be required as compared to the design and manner of arrangement discussed above.

The arrangement according to the exemplary embodiment of the present invention of the components of a converter is believed to have the advantage, as compared to the design and manner of arrangement discussed above, of requiring substantially less room for the same power, and also of ensuring substantially more-intensive cooling of the capacitor. It is believed that the exemplary embodiment packs the components compactly together with substantially improved space utilization. It is also believed that a given volume of space, especially substantially in cylindrical form, and the cooling system, are optimally utilized.

In the arrangement according to the exemplary embodiment of the present invention of a multiphase converter, for that purpose the support is configured as a hollow body; the capacitor or an arrangement of capacitors connected in parallel is provided insertably, in as tightly and precisely fitted fashion as possible, in its interior; and the semiconductor power components are arranged on its outer side. The semiconductor power components are thus arranged around the capacitor as center, separated by the cooling element functioning as support.

According to another exemplary embodiment of the present invention, the hollow body is configured in such a way that it has on the outer side a substantially cylindrical or parallelepipedal configuration, and on its inner side a cylindrical configuration or a configuration adapted to the external shape of the capacitor arrangement. As a further improvement to this configuration, the hollow body is equipped on its outer side with suitable surfaces on which the semiconductor power components can be mounted in good thermally conductive contact with the coolable hollow body.

In another exemplary embodiment of the present invention, which is believed to make available a particularly simple and clearly organized construction, the hollow body is equipped with flat surfaces, and flat outer surfaces are provided, in particular four in the case of two-phase converters, and six in the case of three-phase converters. The components belonging to one half or one third of a bridge can thus be arranged in very clearly organized and attractive fashion, in the form of a parallelepiped or in approximately cylindrical form, around the cooling support, while the capacitor or capacitor arrangement sits in the center and can also be cooled. This compact arrangement is believed to be further improved since the hollow body is substantially of a length in the axial direction that corresponds to the length of the capacitor or the capacitor arrangement.

In another exemplary embodiment of the present invention, a parallelepipedal or cylindrical cover is provided which occludingly surrounds the hollow body serving as support, together with the components mounted in and on it, except for necessary connecting contacts. The components are thereby protected from influences acting from outside, and a self-contained, ready-to-install, and very compact component is thus made available.

According to another exemplary embodiment of the present invention, the hollow body also serves as a support for electrical boards. According to one exemplary embodiment, for example, electrical activation boards for the semiconductor power components are provided on the outer side of the semiconductor power components and their electrical connecting lines. In an exemplary embodiment, electrical control boards can be provided and mounted on one or both end faces of the hollow-body-shaped support.

In another exemplary embodiment of the present invention, the hollow body is equipped with suitable and suitably arranged cooling ducts; a coolant, in particular a liquid one, can be forced through those cooling ducts. In an exemplary embodiment, the hollow body is equipped at one end face with a support part containing cooling ducts through which cooling ducts provided in the outer support wall can be connected to one another, thereby imparting to the hollow body a cup-like shape. The capacitor provided in the interior is thus, very advantageously, surrounded over almost its entire exterior by the cooling hollow-body-shaped support.

The arrangement according to an exemplary embodiment of the present invention is believed to be, very usefully, usable in a variety of applications; it is provided and is believed to be suitable in particular for use in a motor vehicle or an electric vehicle or a hybrid vehicle or a starter-generator drive system.

BRIEF DESCRIPTION OF THE DRAWINGS

FIG. 2 is based.

DETAILED DESCRIPTION

Figure 1:
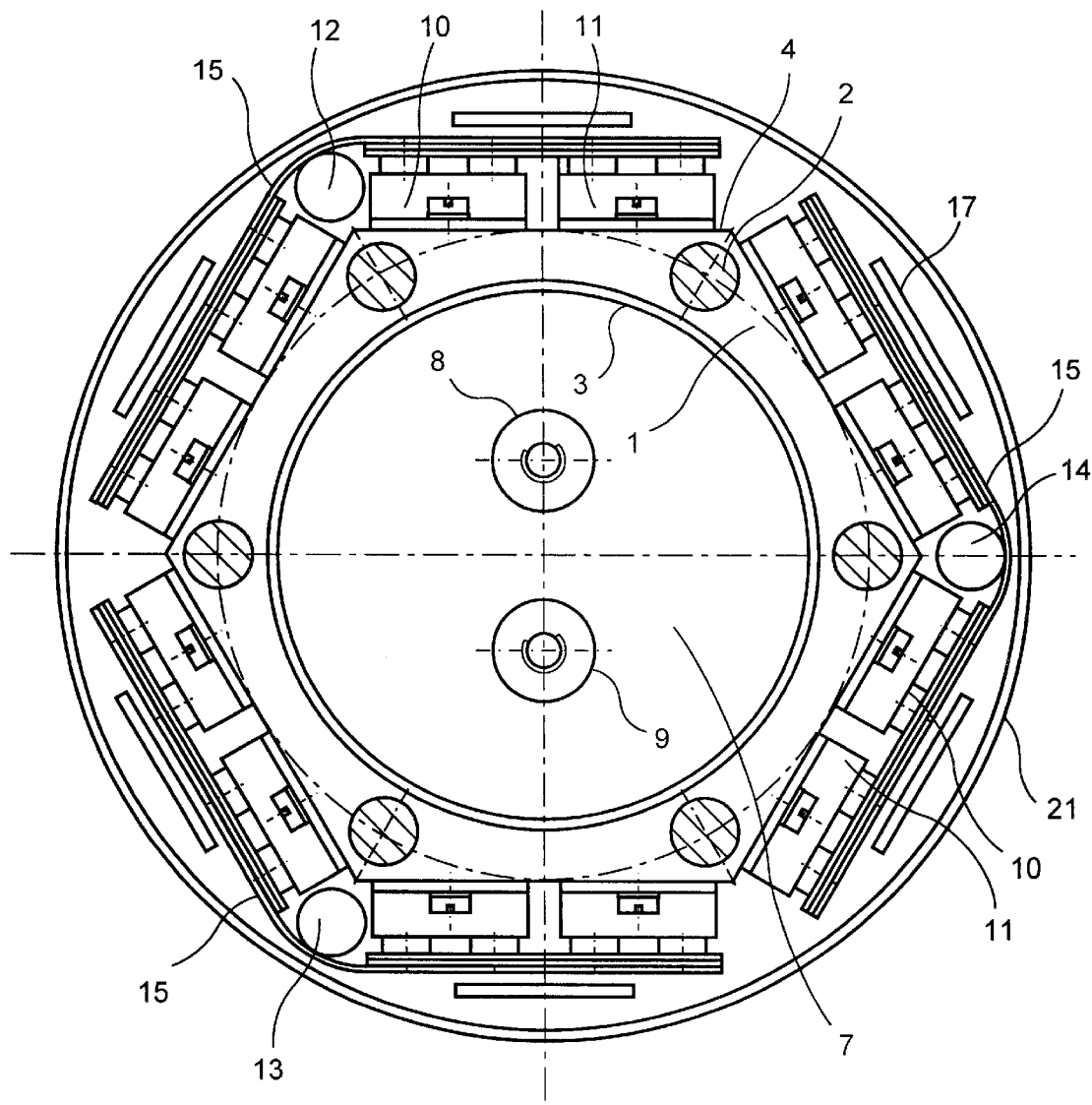
FIG. 1 shows the arrangement according to an exemplary embodiment of the present invention in a plan view, the supporting hollow body being, in the example shown of a three-phase converter, of internally cylindrical configuration and being equipped externally with six flat surfaces in the form of a regular hexagon.
Figure 2:
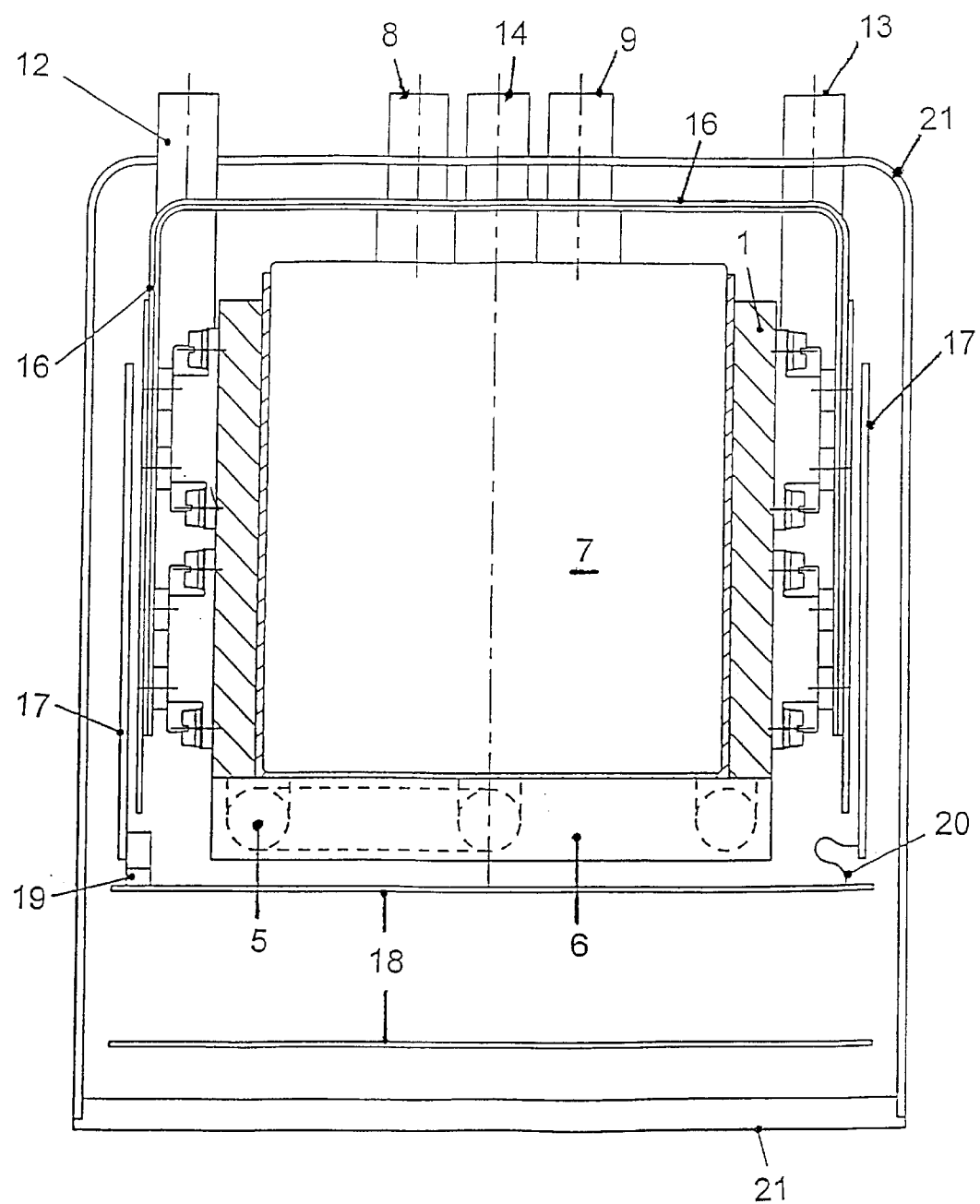
FIG. 2 shows, in a side view and partially in section, the arrangement depicted in FIG. 1 of a three-phase converter.
Figure 3:
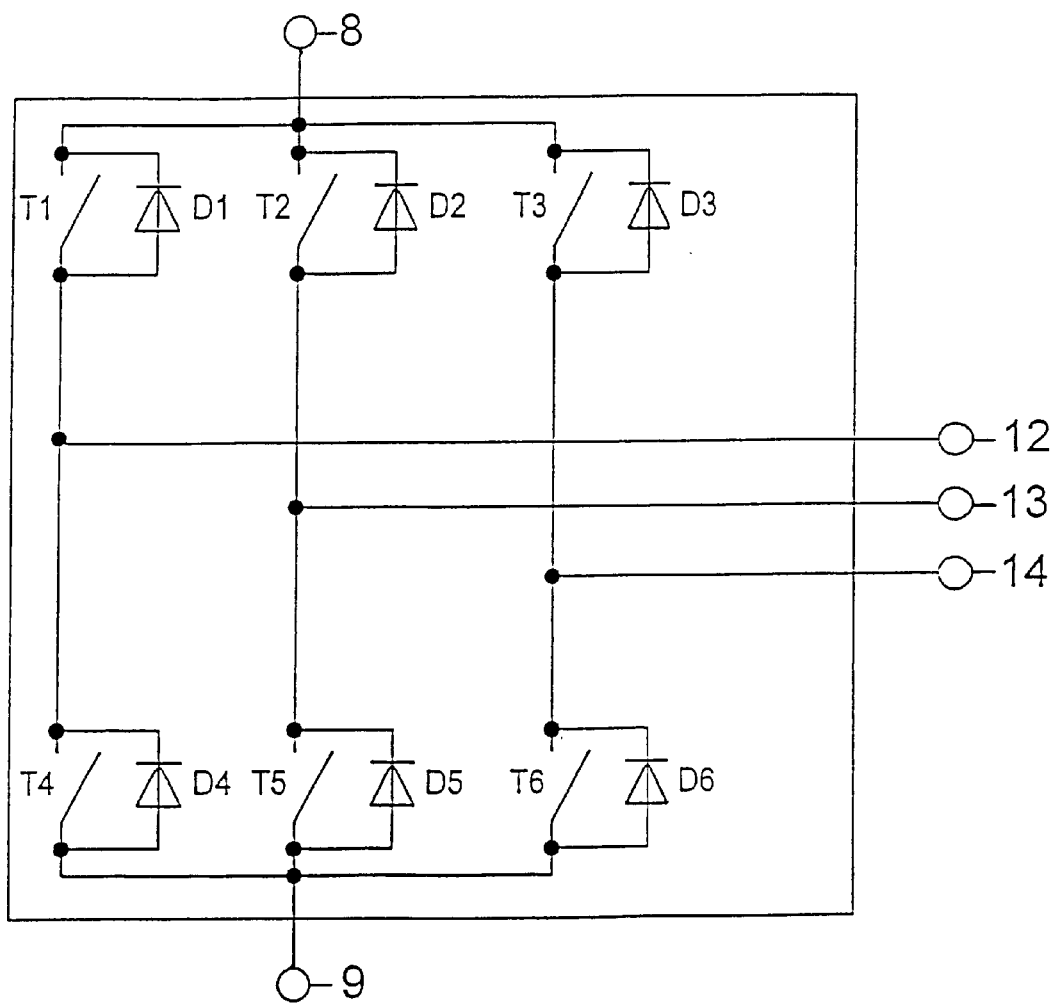
FIG. 3 shows an electrical circuit diagram of the three-phase bridge circuit, with the associated semiconductor power components, on which the arrangement of the components of the converter of FIG. 1

The arrangement according to an exemplary embodiment of the present invention of the components of a converter is depicted schematically in a plan view in FIG. 1, and in a side view and partially in section in FIG. 2. The exemplary embodiment depicted is based on a three-phase converter, of which an electrical circuit diagram of the associated three-phase bridge circuit, with the semiconductor power components necessary for it, is depicted in FIG. 3.

A support 1 configured as a hollow body is equipped with cooling ducts 2, and is configured cylindrically on its inner side 3 and as a hexagon on its outer side 4. The result is to create a substantially cylindrical configuration on outer side 4 of the hollow-body-shaped support 1. As depicted in FIG. 2, the hollow-body-shaped support 1 can be equipped at one end face with a support part 6 containing cooling ducts 5. This support part 6 imparts a cup-like shape to the hollow body, and creates the possibility of connecting cooling ducts 2, contained in the wall of support 1, to one another by way of support part 6 and its cooling ducts 5. Cooling ducts 2 in the hollow-body-shaped support 1 are of suitable shape and mounted at suitable points. In the exemplary embodiment with the hexagonal external configuration, they may be accommodated in the edge region where the wall thickness is somewhat greater.

A capacitor 7, which may be in the form of a high-power electrolytic capacitor, is inserted with as precise a fit as possible into the interior of the hollow-body-shaped support 1. The two terminals 8 and 9 for the positive and negative poles project out at the end face that is open at the top, as depicted in FIG. 2. Otherwise capacitor 7 is tightly surrounded on all sides, except for this end face, by the cup-shaped hollow body 1 that serves as the support, and is thereby completely exposed to its cooling system. Semiconductor power components 10 and 11 are mounted on the outer side of hollow body 1, each on one surface. The semiconductor power components labeled 10, 11 can be, for example, in accordance with FIG. 3, respectively a transistor T1 and a diode D1 connected in parallel with it, and T4 and D4, which are associated with one phase and are arranged on two adjacent surfaces. In the three-phase converter depicted, these are then led out via a connecting line 12, 13, 14. According to FIG. 3, for example, transistor T1 and diode D1, as well as transistor T4 and diode D4 connected in parallel with it on the adjacent surface, belong to line 12. These semiconductor power components which belong to one line, such as in particular line 12, line 13, or line 14, are each connected by a busbar 15. The second phase, which is conveyed out at line 13, comprises the bridge portion with transistor T2 and diode D2 as well as transistor T5 and diode D5 associated with it. Transistor T3 with its diode D3, and transistor T6 with its diode D6, are associated with the third bridge portion of the three-phase converter on line 14. The semiconductor power components associated with each third of the bridge are thus each arranged on one side of line 12, 13, or 14, on the outer surfaces of hollow body 1 lying symmetrically with respect to those connecting lines, and are secured, in effectively thermally conductive contact, on the corresponding flat surfaces of support 1. This is particularly apparent from the plan view of FIG. 1. The direct-current terminal at lines 8 and 9 is conveyed to the semiconductor power components via a busbar 16, as depicted in FIG. 2.

As depicted in plan view in FIG. 1, activation boards 17 are provided on the outer sides outside busbars 15 on each of the six surfaces, and directly activate the semiconductor power components located below them. These six activation boards 17 are connected to a further board, control board 18, by way of either plug connectors 19 or flexible circuit board connectors 20, as depicted on the left and right, respectively, in FIG. 2. The latter also depicts a further board 18 that can also be built into the converter for purposes that are not relevant here. This entire arrangement is surrounded by a cover 21 which is cylindrical in the case depicted here and which completely surrounds all the components except for power leadthroughs 8, 9, 12, 13, 14. This yields a ready-to-install, self-contained component, connectable to lines 8, 9, 12, 13, and 14, with a very compactly packaged converter.

With this exemplary embodiment and the arrangement of semiconductor power components with respect to one another shown therein, a cylindrically defined volume is thus optimally utilized. The cylindrical capacitor 7 is arranged in the center of the hexagonal profile, which is of cylindrical configuration on inner side 3. One power switch of the three-phase pulse inverter is located on each outer surface 4 of the hexagonal profile of the hollow-body-shaped support 1, or several of them are connected in parallel and mounted there. As depicted in the exemplary embodiment, ideally the two switches of a half-bridge or of a bridge portion that belongs together are located on adjacent hexagonal surfaces. In order to achieve a configuration with the lowest possible induction, connection of the half-bridges is accomplished via connecting bars called busbars 15, 16. The five connecting lines 8, 9, 12, 13, 14 can be led out at any suitable position, either radially or axially. In the example depicted, they are led out together axially at one end face. The hollow body or cup-shaped support 1 may be a length in terms of its axial extension that is defined by the overall height of the required capacitor 7.

Be it noted here that in another exemplary embodiment (not shown), for example in the case of a two-phase converter, the outer surface of the hollow-body-shaped support can be configured so that four outer surfaces are provided, and the semiconductor power components that belong to one half-bridge are arranged adjacently, each on two adjacent outer surfaces. Connection and activation with the respective elements are then similar to the exemplary embodiment presented. A parallelepipedal cover is then used in this case as the cover. It is noted that the entire installation volume defined by the parallelepiped, and not just a portion, is then optimally used in this case by the components.

Instead of the one capacitor 7 centrally arranged in the hollow-body-shaped support 1, a capacitor arrangement that includes a number of capacitors in a parallel circuit can be used, and can be arranged centrally in the interior of the hollow body. The interior surface of the hollow-body-shaped support must then correspondingly be optimally adapted to the particular existing shape, and cooling ducts 2 must be provided correspondingly at the most suitable points.

The exemplary embodiment of the present invention concerns arranging the capacitor or capacitors centrally in a hollow body, and arranging the necessary semiconductor components on the outer side of the hollow body. The hollow body contains at suitable points in its wall cooling ducts 2 through which, in particular, a cooling fluid flows, and thus cools the semiconductor components mounted with an effectively thermally conductive interface on the outer side, as well as the power capacitor or capacitors provided in the interior.

What is claimed is:

1. An arrangement of a multiphase converter, comprising:
   at least one semiconductor power component;

at least one capacitor arrangement, the at least one capacitor arrangement including a capacitor; and a support for mounting at least the at least one semiconductor power component, the support including at least one cooling device;

wherein:

the support is configured as a hollow body defining an interior of the support;

the at least one capacitor arrangement is insertable in a tight and precise fitted fashion in the interior of the support;

the at least one semiconductor power component is arranged on an outer side of the support; and the hollow body includes at least one of a parallelepipedal cover and a cylindrical cover, each cover occludingly surrounding the hollow body serving as the support, the at least one semiconductor component, the at least one capacitor arrangement and at least one electrical board being mounted in and on the support, except for at least one connecting contact.

2. The arrangement of claim 1, wherein the hollow body is configured so that it includes, on the outer side of the support, at least one of a substantially cylindrical and a parallelepipedal configuration, and includes, on an inner side of the support, at least one of a cylindrical configuration and an adapted configuration that is adapted to an external shape of the at least one capacitor arrangement.

3. The arrangement of claim 1, wherein the hollow body includes, on the outer side of the support, at least one surface for mounting the at least one semiconductor power component and for providing a thermally conductive contact with the hollow body, the hollow body being coolable.

4. The arrangement of claim 1, wherein the hollow body includes a flat outer surface arrangement.

5. The arrangement of claim 1, wherein the hollow body is substantially of a length in an axial direction corresponding to another length of the at least one capacitor arrangement.

6. The arrangement of claim 1, wherein at least one electrical board is supportable by the hollow body.

7. The arrangement of claim 6, wherein at least one electrical control board is mounted on at least one end face of the hollow body of the support.

8. The arrangement of claim 1, wherein the hollow body includes at least one cooling duct, at least one of a coolant and a liquid coolant being movable through the at least one cooling duct.

9. The arrangement of claim 8, wherein at one end face of the hollow body is included a support part that includes the at least one cooling duct by which at least one cooling duct provided in a wall of the support is connectable to one another for imparting a cup-like shape to the hollow body.

10. The arrangement of claim 1, wherein the arrangement is included in at least one of a motor vehicle, an electric vehicle, a hybrid vehicle and a starter-generator drive system.

11. The arrangement of claim 1 wherein the capacitor is a high-power electrolytic capacitor.

12. The arrangement of claim 4, wherein the flat outer surface arrangement includes six flat outer surfaces for use with a three-phase converter.

13. An arrangement of a multiphase converter, comprising:

at least one semiconductor power component;

at least one capacitor arrangement, the at least one capacitor arrangement including a capacitor; and a support for mounting at least the at least one semiconductor power component, the support including at least one cooling device;

wherein:

the support is configured as a hollow body defining an interior of the support;

the at least one capacitor arrangement is insertable in a tight and precise fitted fashion in the interior of the support;

the at least one semiconductor power component is arranged on an outer side of the support;

at least one electrical board is supportable by the hollow body; and at least one electrical activation board for the at least one semiconductor power component is mounted on an outer side of the at least one semiconductor power component and at least one electrical connecting line of the at least one semiconductor component.

* * * * *